United States Patent
Ádám et al.

(10) Patent No.: US 8,115,240 B2
(45) Date of Patent: Feb. 14, 2012

(54) CMOS INTEGRATED PROCESS FOR FABRICATING MONOCRYSTALLINE SILICON MICROMECHANICAL ELEMENTS BY POROUS SILICON MICROMACHINING

(75) Inventors: Antalné Ádám, Budakeszi (HU); István Barsony, Budapest (HU); Csaba Ducso, Budapest (HU); Magdolna Eros, Budapest (HU); Tibor Mohacsy, Budapest (HU); Károlyné Payer, Budapest (HU); Eva Vazsonyi, Budapest (HU)

(73) Assignee: MTA Muszaki Fizikai Es Anyagtudomanyi Kutatointezet, Budapest (HU)

( * ) Notice: Subject to any disclaimer, the term of this patent is extended or adjusted under 35 U.S.C. 154(b) by 382 days.

(21) Appl. No.: 12/314,547

(22) Filed: Dec. 12, 2008

(65) Prior Publication Data

US 2009/0261387 A1  Oct. 22, 2009

(51) Int. Cl.
*H01L 29/84* (2006.01)
*H01L 41/22* (2006.01)
*H01L 21/8238* (2006.01)

(52) U.S. Cl. ............... 257/254; 257/E29.324; 257/415; 257/E21.632; 438/52; 29/25.35; 73/862.046

(58) Field of Classification Search .................. 257/415, 257/417, 418, 419, 420, 254, E29.324, E21.632; 29/25.35; 73/862.046; 438/52
See application file for complete search history.

(56) References Cited

U.S. PATENT DOCUMENTS

| | | | | |
|---|---|---|---|---|
| 4,745,812 A * | 5/1988 | Amazeen et al. | ....... | 73/862.041 |
| 5,055,838 A * | 10/1991 | Wise et al. | ........... | 340/870.37 |
| 5,237,879 A * | 8/1993 | Speeter | ........... | 73/862.041 |
| 5,479,528 A * | 12/1995 | Speeter | ........... | 382/115 |
| 5,604,144 A * | 2/1997 | Kurtz | ........... | 438/53 |
| 5,665,250 A * | 9/1997 | Iwata et al. | ........... | 438/52 |
| 5,760,530 A * | 6/1998 | Kolesar | ........... | 310/339 |
| 6,007,728 A * | 12/1999 | Liu et al. | ........... | 216/2 |
| 6,122,975 A * | 9/2000 | Sridhar et al. | ........... | 73/754 |
| 7,260,980 B2 * | 8/2007 | Adams et al. | ........... | 73/31.05 |
| 7,509,869 B2 * | 3/2009 | Liu et al. | ........... | 73/756 |
| 7,516,671 B2 * | 4/2009 | Liu et al. | ........... | 73/756 |
| 7,521,257 B2 * | 4/2009 | Adams et al. | ........... | 436/183 |
| 7,661,319 B2 * | 2/2010 | Liu et al. | ........... | 73/774 |
| 7,694,346 B2 * | 4/2010 | Adams et al. | ........... | 850/7 |
| 7,694,586 B2 * | 4/2010 | Rey | ........... | 73/862.042 |
| 2004/0065931 A1 * | 4/2004 | Benzel et al. | ........... | 257/414 |
| 2009/0033341 A1 * | 2/2009 | Son et al. | ........... | 324/663 |
| 2009/0261387 A1 * | 10/2009 | Adam et al. | ........... | 257/254 |

* cited by examiner

*Primary Examiner* — Mary Wilczewski
(74) *Attorney, Agent, or Firm* — Davidson Berquist Jackson & Gowdey, LLP

(57) ABSTRACT

A process for fabricating a monocrystalline silicon micromechanical element integrated with a CMOS circuit element within the CMOS technology, wherein a domain of second conducting property is formed within a substrate of first conducting property; the second conducting property is reverse with respect to the first conducting property. A domain of monocrystalline Si is formed within the substrate for fabricating a micromechanical element. A CMOS circuit element as well as a portion of the domain are covered with a protecting layer. Front-side isotropic porous Si-etching from the exposed surface of the domain continues until the portion that will carry the micromechanical element becomes underetched. A porous Si sacrificial layer is created which at least partially encloses the portion. Then the exposed surface of the porous Si sacrificial layer is passivated by applying a metallic thin film thereon. Finally, the metallic thin film that covers the exposed surface of the porous Si sacrificial layer is removed and the porous Si sacrificial layer is dissolved thereby forming the micromechanical element.

11 Claims, 8 Drawing Sheets

CMOS INTEGRATED PROCESS FOR FABRICATING MONOCRYSTALLINE SILICON MICROMECHANICAL ELEMENTS BY POROUS SILICON MICROMACHINING

The present invention relates to a method for fabricating microelectromechanical devices monolithically integrated with an electronical circuit, wherein building blocks of the microelectromechanical device's electronical and microelectromechanical components are formed in a common manufacturing process and in a simultaneous manner. More specifically, the subject-matter of the present invention is a microelectronical process enabling the production of microcrystalline silicon and micromechanical elements comprising microcrystalline silicon by means of the complementary metal-oxide-semiconductor (from now on CMOS) manufacturing technology, in particular, within the given and well-known framework of the n-well CMOS technology, i.e. by technological steps introduced into between the steps thereof, used extensively in the field of semiconductor industry. The invention also relates to a sensor chip provided with a monocrystalline Si-micromechanical element fabricated by the process according to the present invention.

Integrated circuit (from now on IC) devices optionally integrated with microelectromechanical (from now on MEMS) components of certain function are extensively used nowadays. Large scale and hence cheap production of such integrated elements requires that formation of the MEMS component of the IC device be as integrable as possible into semiconducting manufacturing technologies, particularly into CMOS technology, suitable for fabricating the electronical circuit component of the IC device, the core feature of which is that the fabrication of various active semiconducting elements of the circuit component takes place via a protection achieved by a desired masking of layers (generally of different conduction properties) applied one after the other and via removal and/or modification of predefined portions without such protection through physical/chemical processes. IC tactile sensors constitute one of the most well-spread examples of such IC devices.

According to the presently used technologies, the elements of the MEMS component integrated monolithically with the electronical circuit are formed in most cases from surface deposited thin films by micromechanical machining. A clear advantage of surface processes is the full technological compatibility with the fabrication processes of CMOS based circuits. Due to the polycrystalline structure of the deposited films, mechanical properties of the micromechanical elements (closed and perforated membranes, asymmetrically suspended half bridges and further similar elements) are, however, much worse than that of structures with similar geometries made of monocrystalline silicon; this limits the applicability of these technologies.

Based on the direction and the type of the micromechanical machining of a semiconducting wafer to be used, the presently applied manufacturing techniques of monocrystalline or amorphous Si-micromechanical elements that are compatible with CMOS technologies can be divided basically into three groups, that is, into the groups of (a) back-side micromechanical machining, (b) front-side micromechanical machining and (c) micromechanical machining achieved as a structural rearrangement due to the application of high temperatures.

U.S. Pat. No. 6,122,975 describes a method for manufacturing IC pressure sensors wherein the electronical circuit and the piezoresistive elements arranged on the membrane are fabricated on the front-side of the Si wafer by traditional CMOS technology, while forming of the membrane itself is effected from the back-side of the wafer by anisotropic alkaline etching or by anisotropic alkaline etching combined with an electrochemical etch stop. To form the membrane in the proper position, the etching is initiated from a back-side portion being in alignment with the front-side membrane area. Due to the anisotropic nature of the process, the obtainable lateral membrane dimension falls between few hundreds of micrometers and few millimeters, while the distance between the individual membranes (and hence between the finished IC tactile sensors) is large; it falls into the millimeter range. This, however, is highly unfavoured as far as the density of elements achieved on a single wafer is concerned.

U.S. Pat. No. 5,604,144 discloses a process for fabricating semiconducting transducers, in particular IC pressure sensors. In one of the first few steps of the method, a porous Si sacrificial layer is formed by porous Si-micromachining that is started on the back-side of the wafer behind the front-side area of the membrane to be fabricated. According to the technique suggested, the porous Si is then oxidized, and the circuit components in the front-side area of the membrane and/or in further portions of the chip are formed by traditional CMOS technology. As the completion of the process, the obtained oxide film is dissolved, by means of which the membrane itself becomes also prepared. A disadvantage of the method is that the thickness of the membrane is poorly controlled. Moreover, the high temperatures applied during the CMOS technology challenge the applicability of the method as a whole, since the integrity of the porous Si support layer of a typical thickness of more than 100 micrometers cannot be preserved when the operations are performed.

Limitations of flexibility in geometrical design of IC devices constitute a further common drawback of the processes used for forming the micromechanical elements from the back-side of the Si wafer.

U.S. Pat. No. 6,007,728 teaches a process for preparing IC tactile sensors. In accordance with the CMOS compatible membrane fabricating technology suggested, after the electronical circuit and the circuit components on the membrane to be formed have been prepared, the perforated membrane itself is fabricated from the front-side of the Si wafer in a four-step series of operation. Here, at first a perforation well is created by the anisotropic etching of the silicon in the desired thickness of the membrane to be fabricated, then within the obtained well, the would-be side wall of the membrane is passivated through an oxidation and an anisotropic oxide etching step, and finally starting from the perforation well, the silicon under the membrane is etched at first by anisotropic and then by isotropic Si-etching, whereby the membrane becomes released. A drawback of said process is that it is difficult to control the thickness of the membrane that adversely affects the mechanical strength thereof.

For micromachining achieved in the form of a microstructural rearrangement induced by heat treatment the paper by I. Mizushima et al., entitled "Empty-space-in-silicon technique for fabricating a silicon-on nothing structure" and published in *Applied Physics Letters* (Vol. 77, No. 20, pp. 3290-3292) provides an example. By this process (the so-called "silicon-on-nothing" technique) a monocrystalline Si-membrane of 1 to 2 micrometers in thickness and a cavity thereunder with a similar thickness are formed due to the driving force of surface tension during a heat treatment performed above 1000° C. and under a reducing atmosphere from the wells with few tenths of micrometers in diameter formed in the Si wafer with a suitable density.

A publication of S. Armbruster et al., entitled "A novel micromachining process for the fabrication of monocrystalline Si-membranes using porous Silicon" (Conference Transducers '03, held from 8 to 12 Jun. 2003, Boston, USA; Proceedings of the conference, pp. 246-249) discloses a new surface micromachining technique for the fabrication of monocrystalline Si-membranes, wherein Si double layers of different porosities are subjected to heat treatment at high temperatures in a reducing atmosphere, inducing thereby a rearrangement similar to the above-discussed structural rearrangement and forming in this way the membrane with a thickness ranging from few tenths of micrometers to 1 micrometer, as well as the cavity under the membrane.

A common feature of the processes based on the microstructural rearrangement is that the very thin monocrystalline Si-membrane is thickened by epitaxial layer deposition and the full CMOS technological series of operations for fabricating the electrical circuit, as well as the components on the membrane is started only afterwards. This results in introducing an extra step (of epitaxial thickening), as well as the use of suitable apparatus(es) for the implementation thereof and hence an increase in the manufacturing costs. A further drawback of the two techniques suggested is that only a cavity of a limited thickness can be formed thereby under the membrane and during forming of the membrane at high temperatures, also a significant extent of deformation appears.

A technique closest to the solution according to the present invention that is compatible with the CMOS manufacturing technology and includes front-side porous Si-micromachining is discussed by G. Kaltsas et al. in a paper entitled "Frontside bulk silicon micromachining using porous-silicon technology" and published in *Sensors and Actuators A* (Vol. 65, pp. 175-179, 1998) for the fabrication of polycrystalline micromechanical components, in particular a membrane above a cavity on a polycrystalline Si wafer. This process, however, has got two substantive drawbacks. As the process starts with a polycrystalline Si layer, the resulting Si-membrane also has a polycrystalline structure and it—compared to a membrane made of monocrystalline silicon—is much worse in quality and less sensitive. Therefore, an IC device, e.g. a pressure sensor, prepared by using it is capable of proper operation in a narrower pressure range and with smaller sensitivity and/or it is less reliable, compared to a pressure sensor with the same architecture, but being prepared by using monocrystalline Si-membrane. The other drawback of the process concerned is the significant amount of residual stress being present within the bulk of the fabricated polycrystalline Si-membrane that can result in warping (deformation) of the membrane in certain cases—as it is also mentioned by the authors of the paper at issue. To remove said residual stress, the polycrystalline Si-membrane must be subjected to a heat treatment carried out at a relatively high temperature, at about 1100° C., which on the one hand represents a further step to be introduced into the CMOS technology, and on the other hand increases the manufacturing costs of the IC device.

In view of the above it is clear that a great number of documents make mention of CMOS compatibility of the porous Si-micromachining. However, up to now neither a device, nor a technology has been mentioned and/or discussed in detail that would be suitable for the fabrication of micromechanical components (for instance, closed and perforated membranes, asymmetrically suspended half bridges, and similar further components) of monocrystalline (or amorphous) silicon monolithically integrated with CMOS circuits.

The aim of the present invention is to eliminate or at least to decrease the drawbacks of the presently known and above detailed various fabrication processes.

In particular, the aim of the present invention is to provide a process for fabricating monocrystalline Si- (or monocrystalline silicon-containing amorphous) micromechanical component(s) of arbitrary size integrated monolithically with CMOS circuits and which also ensures a high component density.

A further aim of the present invention is to provide a process capable for the fabrication of IC devices, the integrated MEMS components of which can perform their tasks with higher sensitivity and better mechanical stability, as well as optionally with no hysteresis, relative to the respective MEMS components of the IC devices formed by the prior art techniques.

A yet further aim of the present invention is to provide an integrated CMOS technology with higher flexibility in geometrical design for the fabrication of MEMS components integrated monolithically with electronical circuits.

A yet further aim of the present invention is to provide, in particular, an integrated sensor chip containing micromechanical elements with the mechanical and electrical properties of monocrystalline silicon that are much more advantageous than those of polycrystalline silicon.

The present invention provides a process meeting the above aims for fabricating a monocrystalline Si-micromechanical element integrated with a CMOS circuit element within the framework of CMOS technology, comprising (a) forming a domain of second conducting property within a substrate of first conducting property, the second conducting property being reverse with respect to the first conducting property;

(b) forming a domain of monocrystalline Si simultaneously with or immediately after step (a) within the substrate for fabricating a micromechanical element;

(c) fabricating a CMOS circuit element within the substrate through the known steps of CMOS technology;

(d) covering the circuit element, as well as a portion of said domain for fabricating the micromechanical element that will carry the micromechanical element after its fabrication with a protecting layer;

(e) starting a front-side isotropic porous Si-etching from the exposed surface of said domain for fabricating the micromechanical element and continuing the etching until said portion that will carry the micromechanical element after its fabrication becomes at least in its full extent underetched, thereby creating a porous Si sacrificial layer which at least partially encloses said portion that will carry the micromechanical element after its fabrication;

(f) passivating the exposed surface of said porous Si sacrificial layer by applying a metallic thin film thereon;

(g) forming metallic contact pieces of the circuit element through the known steps of CMOS technology; and (h) removing the metallic thin film that covers the exposed surface of the porous Si sacrificial layer and forming the micromechanical element by chemically dissolving said porous Si sacrificial layer.

Further preferred embodiments of the process according to the invention are defined by Claims 5-11.

A sensor chip meeting the above aims is prepared by the process integrated into the CMOS technology according to the invention and comprises a micromechanical part made of monocrystalline silicon by porous Si-micromachining and an electronical circuit component formed integrated with the micromechanical part.

In a further aspect, the present invention also provides a tactile sensor array based on the sensor chips fabricated in accordance with the process according to the invention.

In what follows, the invention is discussed in detail with reference to a manufacturing process integrated into the CMOS technology for fabricating a monocrystalline Si-membrane built together with an electronical circuit and on basis of a drawing, wherein FIG. 1 shows the electronical circuit prepared by the traditional CMOS technology and the circuit elements arranged on the micromechanical element provided as a membrane protected by a multilayer of silicon dioxide, silicon-enriched silicon nitride and undoped polycrystalline silicon layers; FIG. 1 also clearly shows the perforations for forming a perforated monocrystalline Si- and/or silicon-enriched silicon nitride membrane carrying monocrystalline silicon;

Figure 6A:
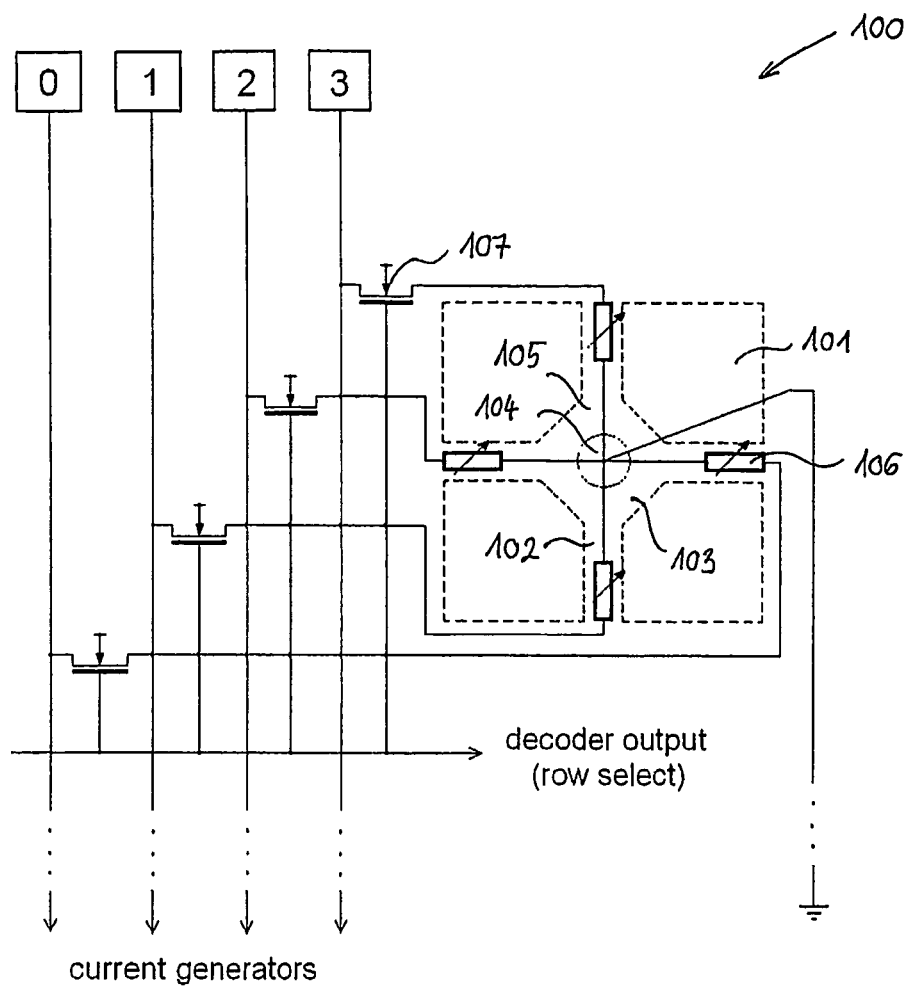
Figure 6B:
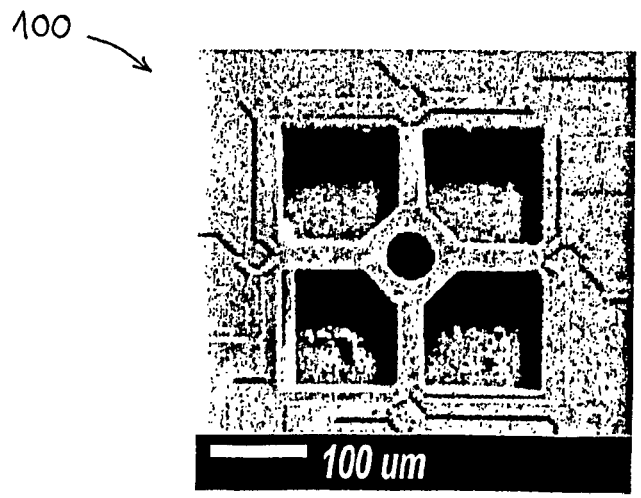
Figure 7A:
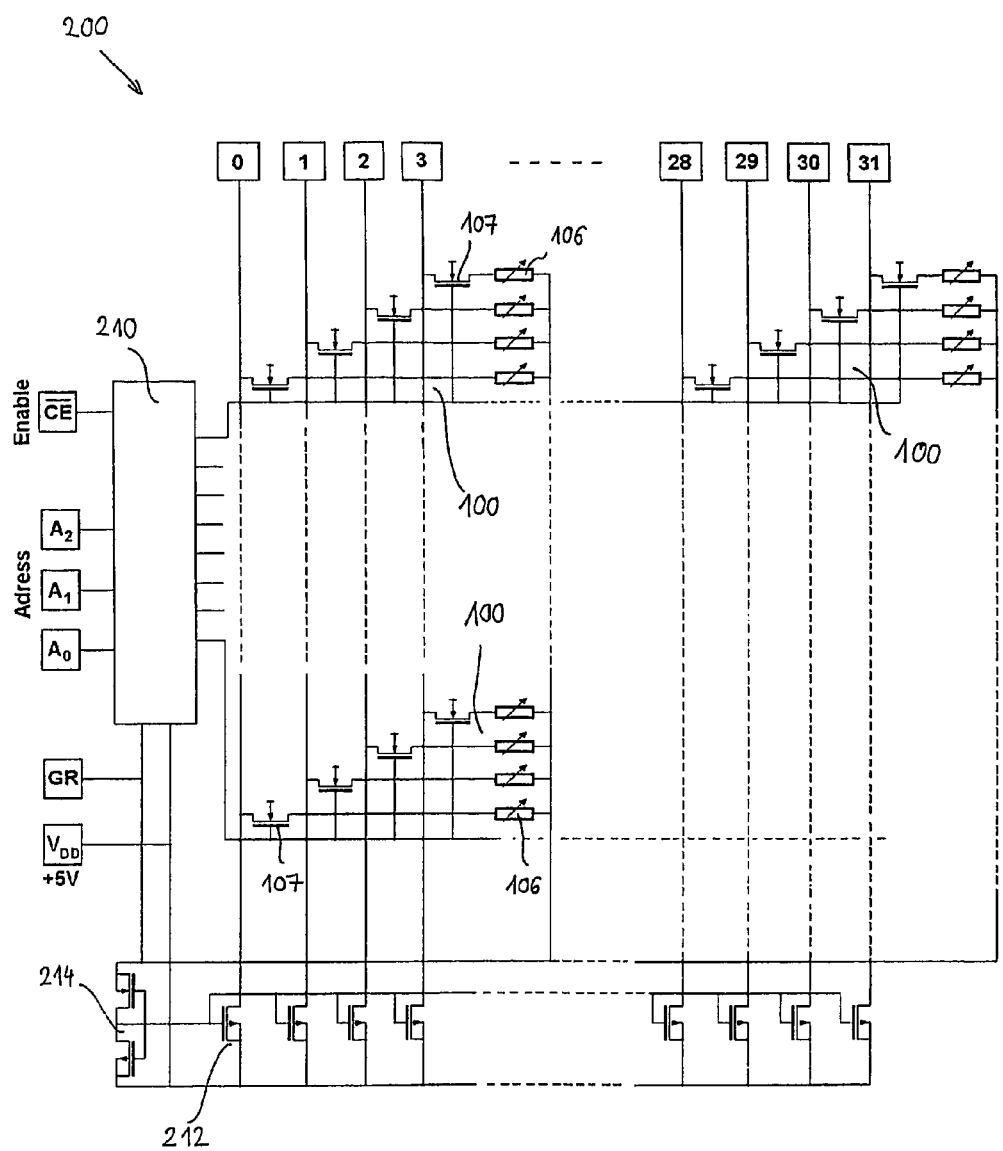
Figure 7B:
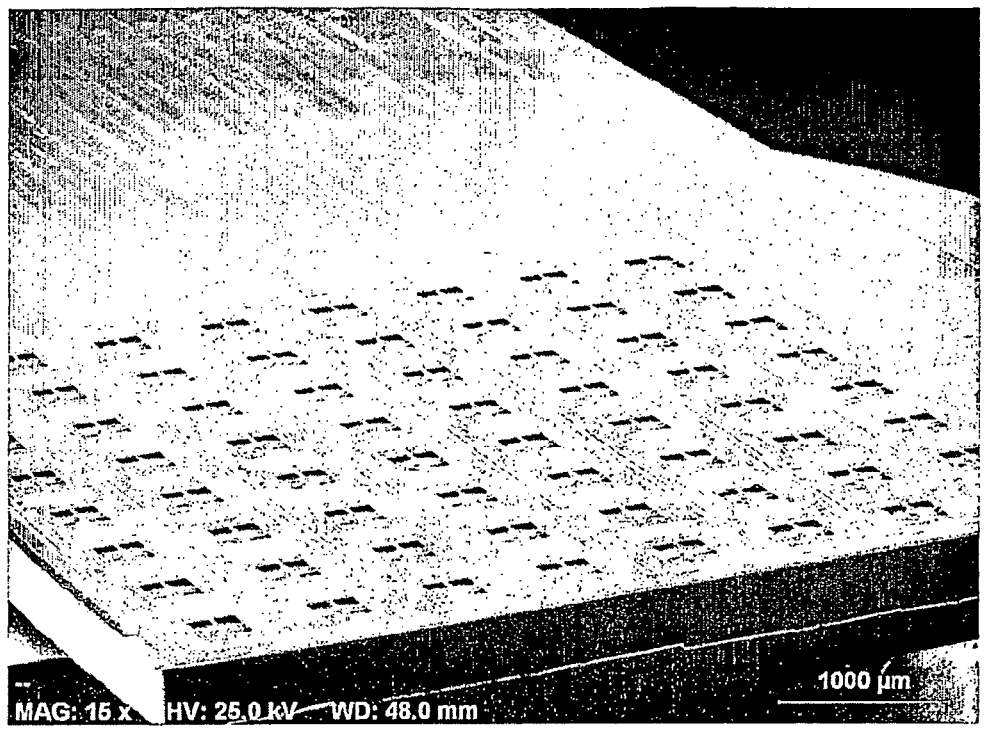
Figure 7C:
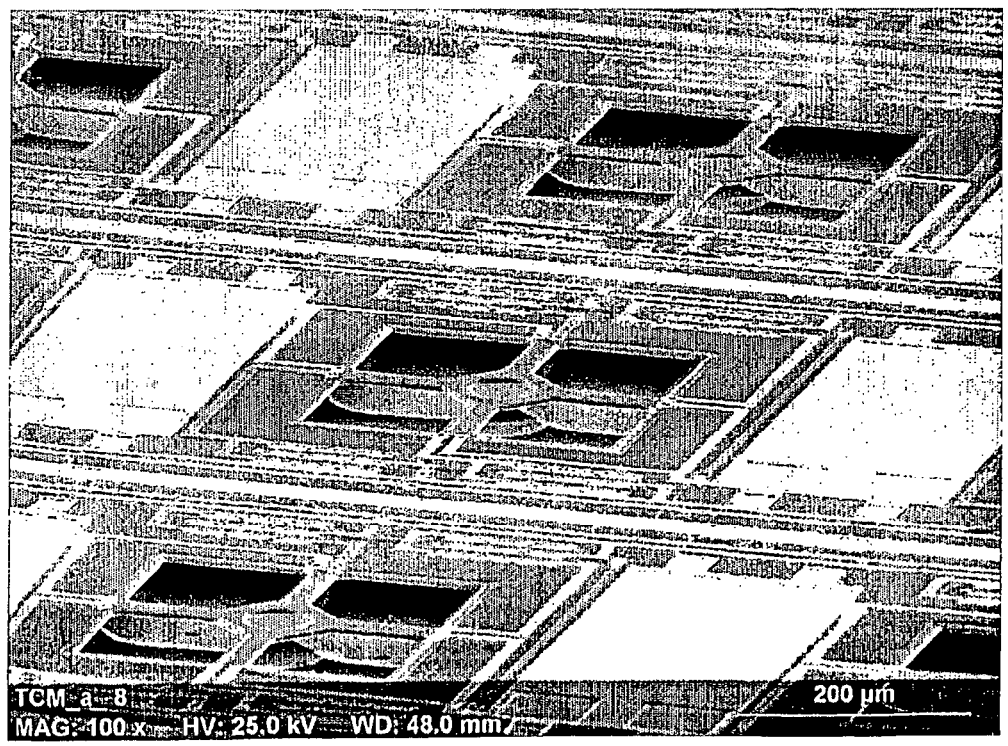

FIG. 6A schematically shows an integrated 3D micro force sensor having a membrane fabricated by the process according to the invention;

FIG. 6B is a micrograph of the 3D micro force sensor shown in FIG. 6A taken by a scanning electron microscope (SEM);

FIG. 7A schematically illustrates a planar tactile sensor array built up of eight by eight 3D micro force sensors that are shown in FIGS. 6A and 6B;

FIG. 7B is a micrograph of the planar tactile sensor of FIG. 7A taken by a scanning electron microscope (SEM); and FIG. 7C is a micrograph of a part of the sensor array of FIG. 7A taken by a scanning electron microscope (SEM), in which the perforated membrane forming the micromechanical element and the CMOS electronical circuit integrated with the micromechanical element can be equally seen.

The series of technological operations to be discussed in the followings constitutes merely a preferred embodiment. It is apparent that a person skilled in the art can modify/alter it without exceeding the scope claimed. The thickness and the doping rate of the individual thin films with different conduction properties formed in accordance with the consecutive steps of the inventive process, the doping material species used to provide the majority charge carriers, the technological parameters of the applied ion implantation techniques, the technological parameters of the heat treatments if needed, the technological parameters of the photolithographic steps applied in certain cases, the masking photoresists used and/or the chemicals used to remove them and the concentrations of the latter correspond to the respective parameters/materials of the traditional CMOS technologies. Hence, these details are not discussed here—except if it is stated to the contrary—as they can be found in the relevant literature. Here and from now on the term "traditional microelectronical process" refers to one of thin film deposition, ion implantation, wet/dry chemical etching, heat treatment and photolithographical development and/or to a combination of at least two of these taking place in a given order set by the CMOS technologies.

In what follows, the process according to the invention is outlined with reference to FIGS. 1 to 5 and in relation to the fabrication of a free-standing or suspended monocrystalline Si-micromechanical element (in particular, a perforated membrane) also carrying circuit elements and integrated with CMOS circuit elements.

In a first step of the inventive process, in harmony with traditional CMOS technologies, an n-well 2A for CMOS circuitry is fabricated in a monocrystalline Si-bulk 1 (silicon wafer substrate) having a first conduction property (here p-type) through traditional microelectronical processes by making use of a semiconducting material having a second conduction property (here n-type) differing from said first conduction property. In this way, simultaneously, n-p and p-n junctions (not shown in the drawing), as well as n-type monocrystalline Si-membrane patterns 2B to be formed by the front-side selective porous Si-micromachining (in this case particularly by etching) are also fabricated, the latter with a thickness of 1 to 15 micrometers. After this, gate electrodes of n- and p-channel MOS transistors (gate oxide 4 and doped polycrystalline Si-layer 5) insulated by a field oxide 3 from one another, as well as $n^+$-type source electrodes 6 and $p^+$-type drain electrodes 7A and respective circuit elements 7B of the membrane patterns 2B are fabricated through traditional microelectrical processes. Then the whole surface of the wafer but the area of the membrane is coated with a passivation CVD oxide (silicon dioxide) layer 8, in accordance with the CMOS technology. After this, a silicon nitride layer 9 enriched in silicon (i.e. of non-stochiometric composition) having an optical refractive index falling between 2.15 and 2.30, a reduced amount of residual mechanical stress and good electrical insulation properties is applied to the whole surface of the wafer in a thickness of 100 to 2000 nanometers by low pressure chemical vapour deposition (LPCVD). In a next step said silicon nitride layer 9 is removed by a selective etching performed with known substances from the locations of the electrodes 6, 7A and of the electrical contact pieces of the electrical elements 7B, as well as from the location of a perforation 10 required for the fabrication of the membrane. Then, the surface of the wafer but the areas of the membrane and the perforation 10 is coated by an undoped polycrystalline Si-layer 11 in a thickness of 200 to 1500 nanometers in such a manner that the area to be protected from porous Si-etching be covered also sideways by the Si-layer 11.

Figure 1:
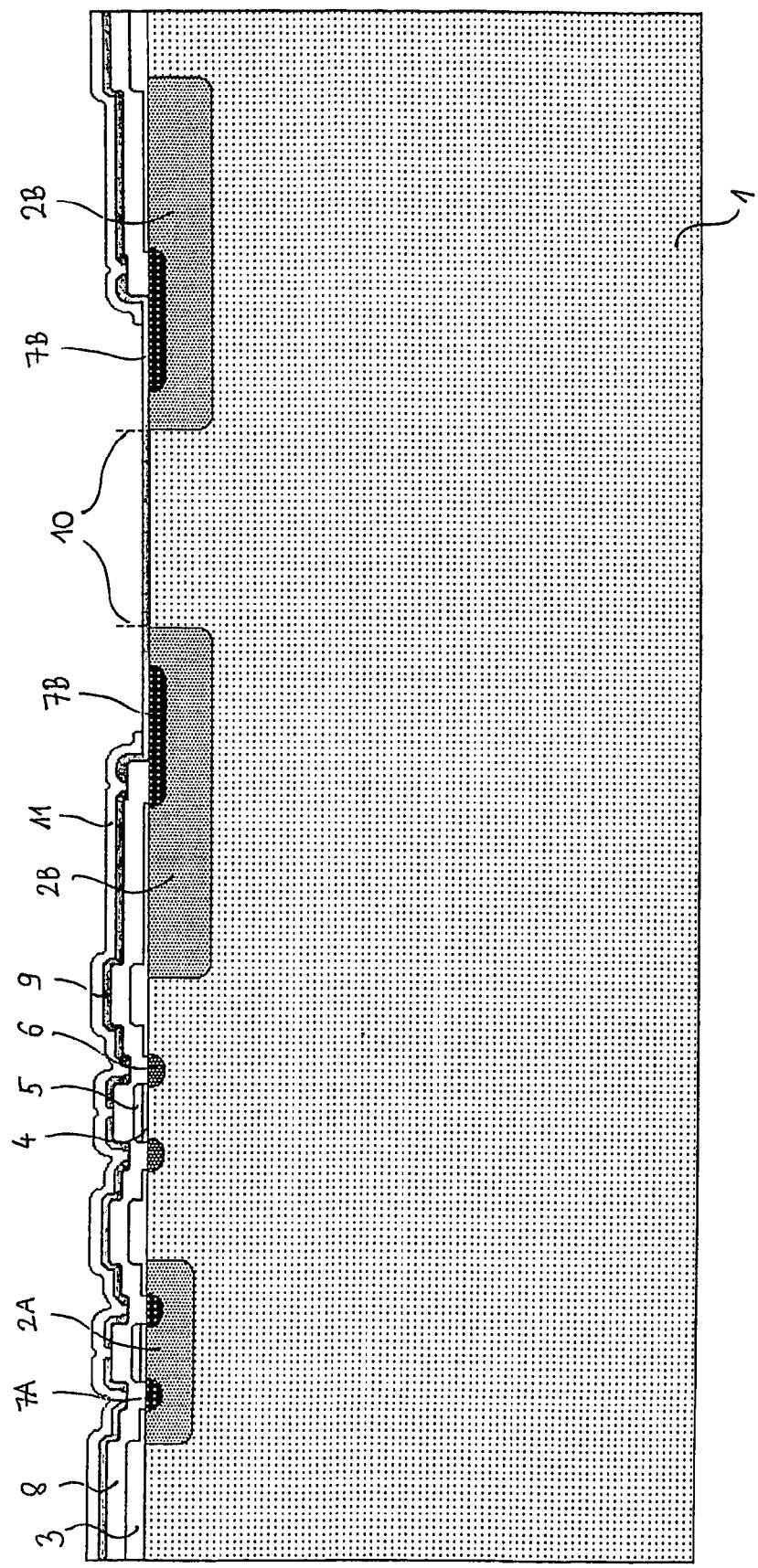
Figure 2:
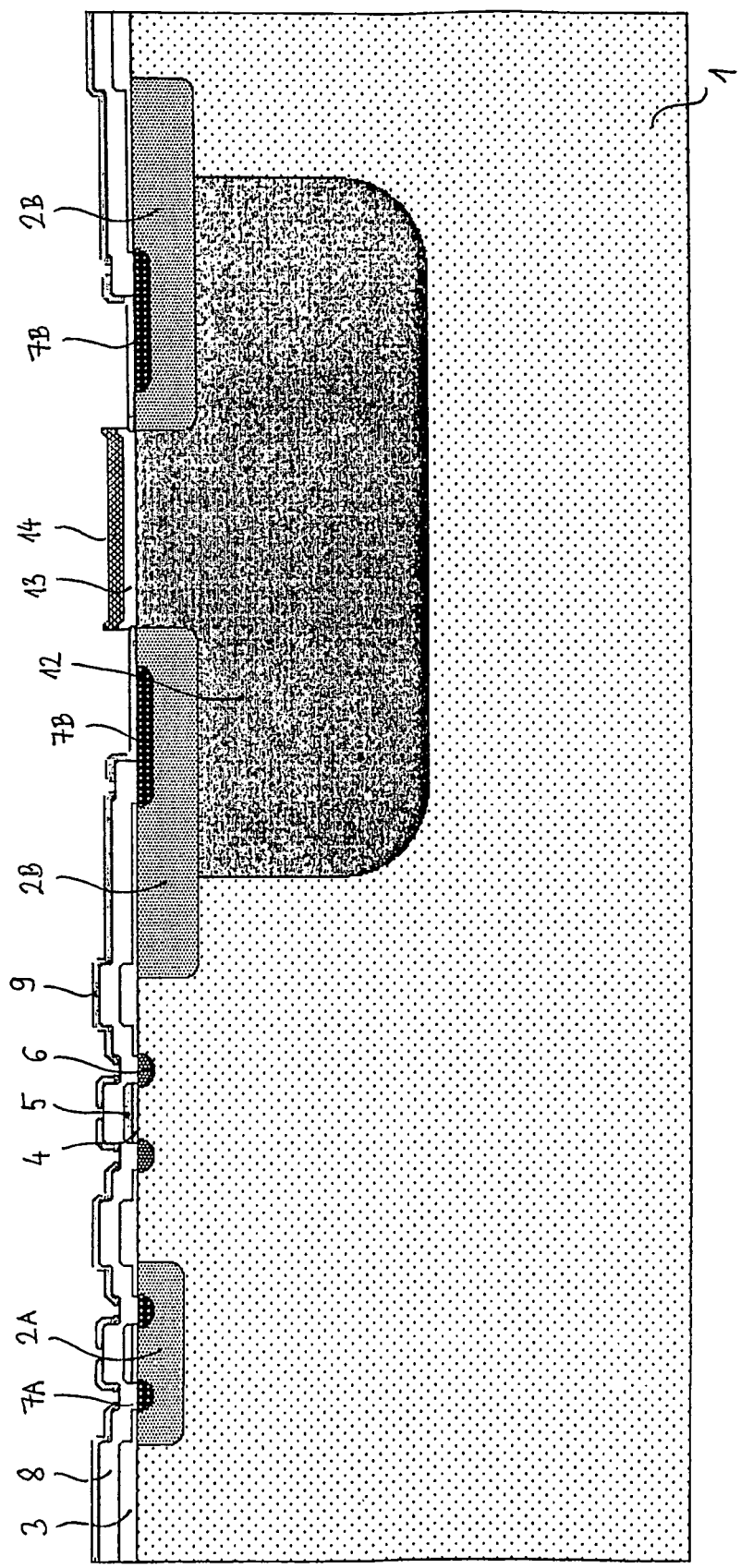
FIG. 2 illustrates the porous Si sacrificial layer obtained by isotropic porous Si-etching started at the perforations and continued until full underetching of the membrane, as well as the Al/fotoresist thin films protecting its exposed surface until a dissolution performed in the very final step of the series of operations.

As it is shown in FIG. 2, the selective front-side isotropic porous Si-etching started at the locations of the perforation 10 is continued until the membrane becomes fully underetched or further, whereby a porous Si sacrificial layer 12 is formed under the membrane patterns 2B. The porous etching is performed by using technological parameters and materials known by a person skilled in the art. Then, the exposed surface of the porous Si sacrificial layer 12 to be dissolved only at the very end of the series of operations is coated by a metallic thin film 13 (in particular made of aluminium). By applying the metallic thin film 13, the porous Si sacrificial layer 12 obtained by the porous Si-etching (its integrity) is protected against further traditional microelectronical processes used to form further electronical circuit elements in accordance with CMOS technologies. The metallic thin film 13 is coated with a photoresist lacquer layer 14.

Figure 3:
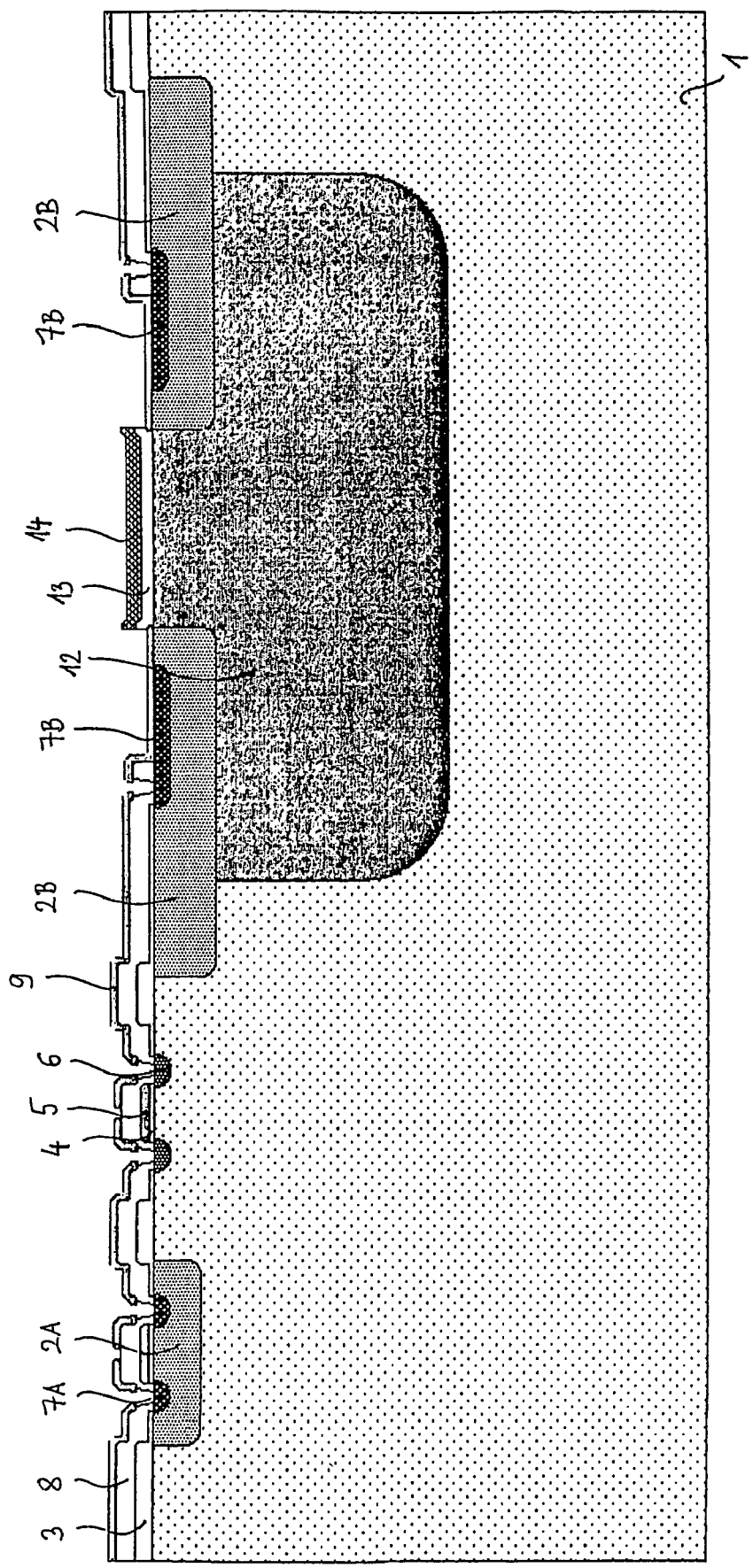
FIG. 3 shows the removal of the very top layer (formed of undoped polycrystalline silicon) of the multilayer protecting the circuit elements against the porous Si-etching and the opening of contact windows to the circuit elements.

After this, as it is shown in FIG. 3, the undoped polycrystalline Si-layer 11 protecting the CMOS circuitry is removed through a chemical etching by means of appropriate etching liquids known by a person skilled in the art, and contact windows are opened to the electrodes 6, 7A and circuit elements 7B within the CVD oxide layer 8 lying under the silicon nitride layer 9 using the silicon nitride layer 9 as masking material.

Figure 4:
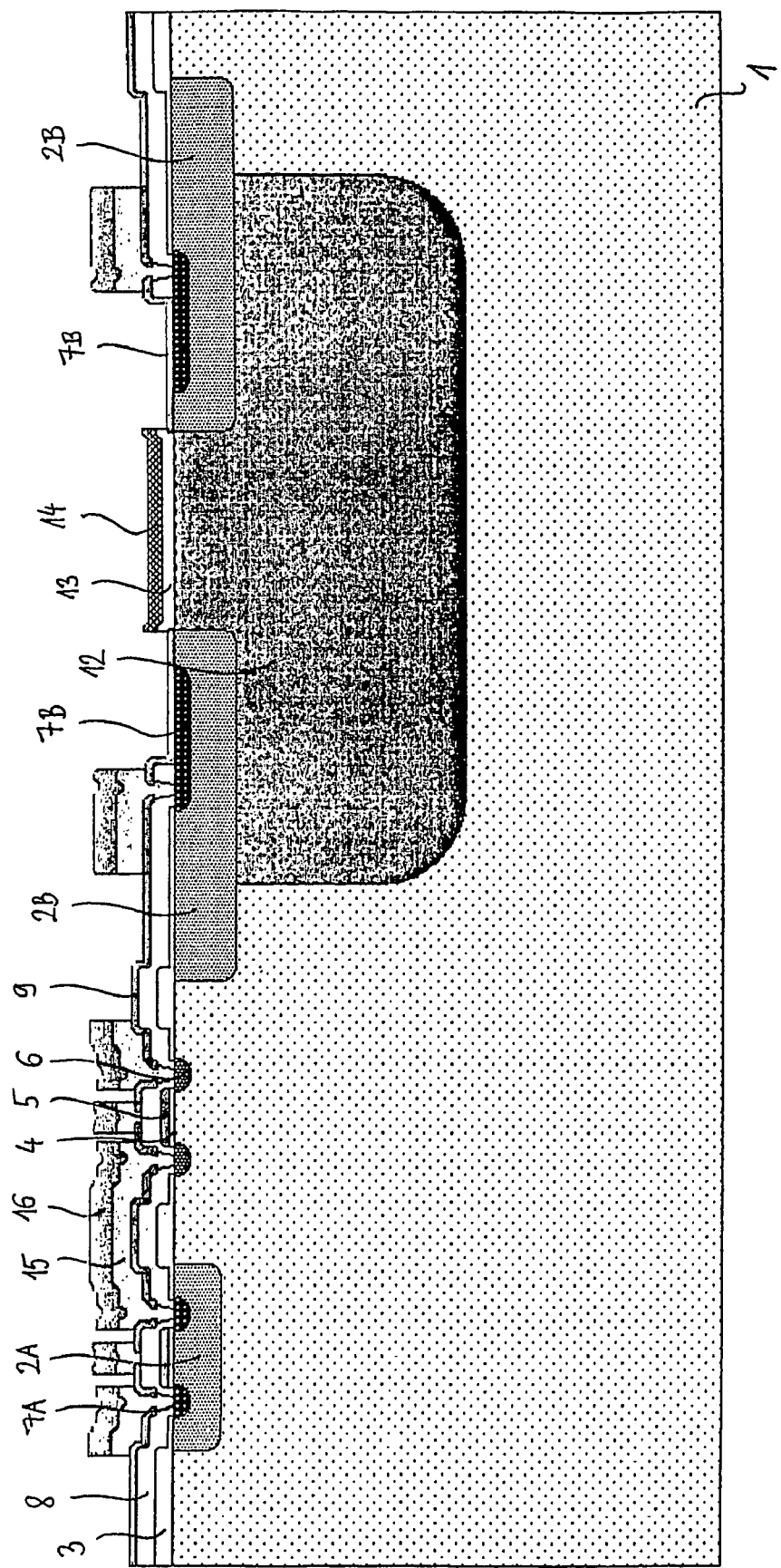
FIG. 4 shows the formation of circuit contact pieces by means of depositing a metallic thin film and photolithographic pattern formation.

In a next step of the process integrated into the CMOS technology, the circuit contact pieces (which can be either single- or multilayered depending on the technological complexity) are formed by depositing a metallic thin film 15 allowing further photolithographical machining of the porous Si sacrificial layer 12 and by photolithographical pattern formation, as shown in FIG. 4.

Figure 5:
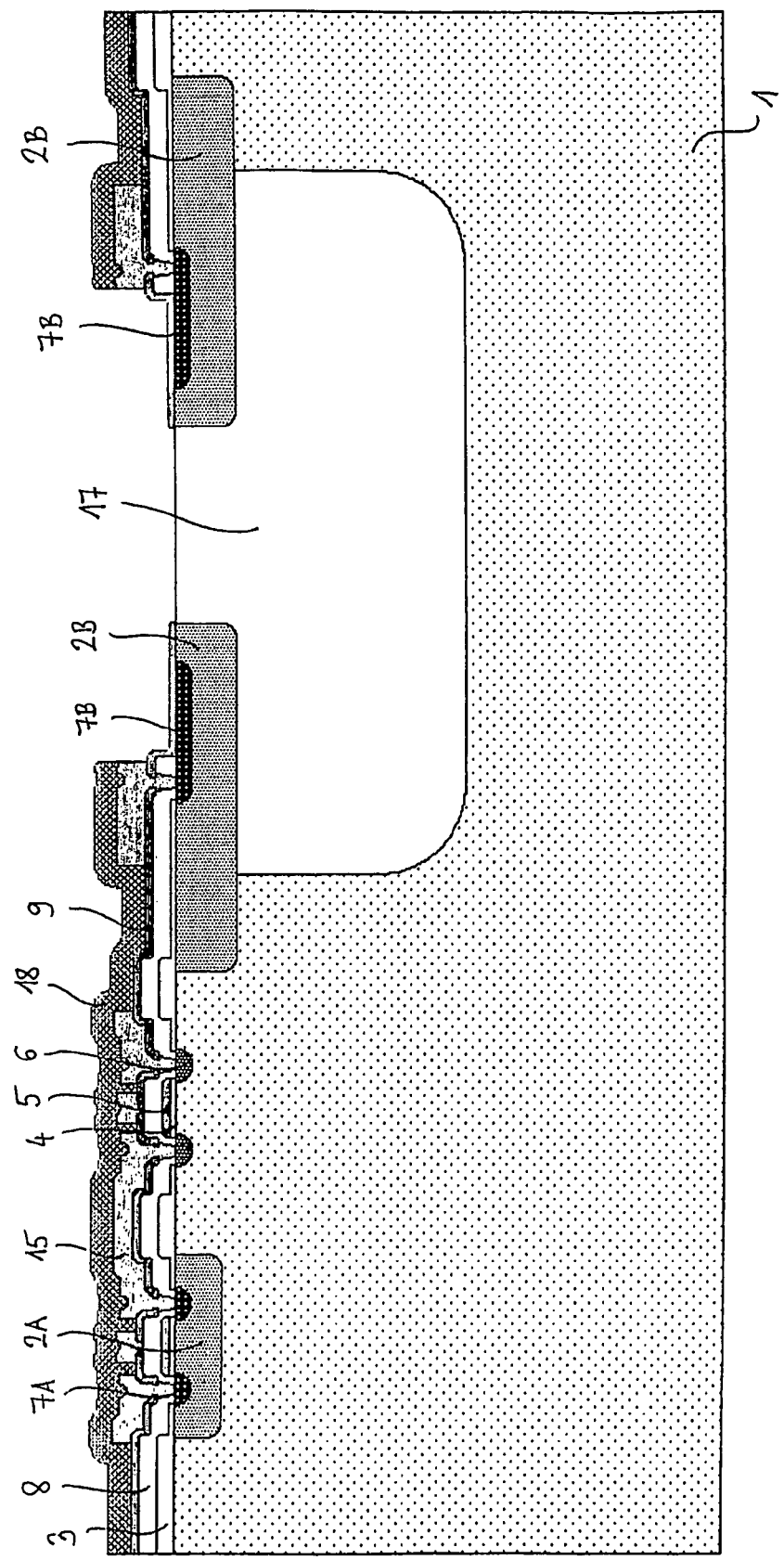
FIG. 5 illustrates dissolution of the lacquer layer that is applied when the finished chips are diced, as well as of the porous Si sacrificial layer.

Finally, as it is shown in FIG. 5, after having coated the electrical circuit component with a protecting lacquer layer 18, the Si wafer is diced into separate chips each comprised of a monocrystalline Si-micromechanical element integrated with CMOS circuit elements, and then the protecting lacquer layers 16, 18 and the metallic thin film 13 protecting the porous Si sacrificial layer 12 are dissolved separately from each of the chips obtained. After this, the porous Si sacrificial layer 12 is dissolved from under the membrane constituting the micromechanical element in a given mixture of NaOCl and a photoresist developer. For this, a mixture of NaOCl/photoresist developer with a composition falling preferably between 1:3 and 1:10 is used.

As a result of the series of operations discussed above, a micromechanical element spanned above a cavity 17 and provided with circuit elements 7B, as well as CMOS circuits with functions required for the operation of the chip are obtained in an integrated form.

In view of the above steps it is clear that such semiconducting IC devices comprising an electronical circuit and a MEMS component integrated monolithically can be fabricated by the technological series of operations constituting the inventive process which include MEMS component(s) capable of performing sensing and/or actuating functions—through exploiting the excellent mechanical and electrical properties of monocrystalline Si—with higher sensitivity, better mechanical stability and without hysteresis compared to IC devices fabricated through a traditional manner, along with an increased density of elements and a higher flexibility in design with respect to membrane geometries.

Knowing the series of operations constituting the inventive process, it is also clear that the Si wafer, including the surface of the micromechanical element(s) as well, optionally can be subjected to CMOS step(s) aiming at fabricating further (active) circuit elements before a front-side dissolution of the Si sacrificial layer created by porous Si-micromachining and also providing mechanical protection of the micromechanical element(s) formed during the manufacturing process. Hence, the circuit component of the chip can be expanded with further elements that results in chips capable of performing more complex functions.

Moreover, the technological series of operations constituting the inventive process is also suitable for the preparation of such amorphous micromechanical element(s) integrated with a CMOS circuitry which is/are made of silicon nitride enriched with silicon and having the above-defined properties. Said amorphous micromechanical element(s) can be prepared by a technique similar to the outlined technology; the difference lies in that in such cases the monocrystalline Si domain serves exclusively for the fabrication of circuit elements to be formed in a layer located under the membrane. The membrane is made of silicon nitride that carries the circuit elements as being suspended.

The monocrystalline Si or amorphous MEMS components obtained by the inventive process through the steps introduced into the CMOS technology and the electronical circuits that are monolithically integrated therewith and operate/drive/read out sensing and/or actuating units, process, in certain cases preamplify, (de)multiplex, convert the electrical signals of the latter, as well as communicate with the outside can be used for manufacturing integrated chips for performing various tasks. 3D micro force sensors, tactile sensors, various microswitches, displacement limiting members, micromirrors or thermally insulated microheaters with a monocrystalline Si heating filament form only some illustrative and non-limiting examples of such integrated chips. The latter can be used preferably for manufacturing catalytic gas detectors (e.g. pellistors, wherein the catalyst is distributed within a porous matrix having a large surface and a great (µg-mg) mass), sensors of the Taguchi-type (wherein a semiconducting metal oxide or a polymer of large surface form the sensing substance), gas sensors based on measuring of heat conductivity, flow sensors, various microreactors, as well as thermal sensors operating at low temperatures (such as bolometers, diodes, thermopairs) in the integrated form.

The size of the micromechanical elements of the integrated devices (chips) listed above—depending on the field of use—falls into a relatively broad range, i.e. it ranges from a micrometer up to few hundreds of micrometers. Consequently, a feature of the inventive process according to which micromechanical elements of basically any dimension can be fabricated by the process is extremely preferred as far as the fabrication of said chips is considered.

EXAMPLE

In what follows, a monocrystalline Si based IC device, in particular a 3D micro force sensing taxel ("tactile pixel") fabricated by the process according to the invention will be shown to illustrate the applicability of the inventive process.

The 3D micro force sensing taxel 100 of FIG. 6A has a membrane 105 being spanned above a cavity 101 formed by the porous Si-etching step introduced into traditional CMOS technology. The membrane 105 is built up of four stationary bridging elements 102 basically perpendicular to each other and a central sheet 103 supported by the bridging elements 102 which is provided with an opening 104 in the middle. As the central sheet 103 is relatively rigid compared to the narrow bridging elements 102, when a load is applied on the taxel 100, only the bridging elements 102 become deformed. The opening 104 is formed to increase the sensitivity of the taxel 100 with respect to shear forces, it can receive optionally a load transmitting member.

A $p^+$-type piezoresistive element 106 with a direction of [110] is formed on each bridging element 102. Every piezoresistive element 102 functions as a separate stress sensor. The individual piezoresistive elements 106 generate electrical signals that are proportional to the spatial components of the load (force) acting upon the taxel 100. The piezoresistive elements 106 each has a nominal resistivity of 2 kΩ. Each piezoresistive element 106 is connected to an n-channel MOS transfer gate 107. Each piezoresistive element 106 and transfer gate 107 pair is driven by a p-channel MOS transistor (not shown) in the current generator mode.

The total size of a single taxel 100 fabricated by the process according to the invention is about 700 µm by 700 µm, while the planar dimensions of the sensing element of the taxel 100, that is, of the membrane 105 made of monocrystalline silicon are about 300 µm by 300 µm. The membrane 105 is about 8 µm in thickness which gives adequate mechanical strength to the membrane 105.

FIG. 6B is a micrograph of the 3D micro force sensing taxel 100 of FIG. 6A taken by a scanning electron microscope.

FIG. 7A illustrates a tactile sensor array 200 built up of the 3D micro force sensing taxels 100 of FIG. 6A. The sensor array 200 is comprised of eight by eight taxels 100, which are fabricated by the inventive process, arranged horizontally and vertically side-by-side, that is sixty-four taxels 100 altogether, as well as the electronical circuitries required to read out, to drive, etc. the taxels 100. The circuit elements are formed essentially simultaneously with the taxels 100 and by the same process. The size of the active (sensing) area of the sensor array 200 is about 7 mm by 6 mm, and thus taking the size of the individual taxels 100 also into account, the spatial resolution of the sensor array 200 will be 0.5 to 1 mm.

Read-out of the electrical signals generated by the individual taxels 100 takes place in a row-by-row manner through CMOS decoders 210 (eight pieces, one for each row) constituting integral part of the sensor array 200. This means a simultaneous read-out of 8×4 individual signals. Selection of the addressed row is performed by the decoder 210 formed of CMOS inverters. Each piezoresistive element/transfer gate pair of each taxel 100 is driven by a single p-channel MOS transistor 212 in the current generator mode. To allow a current flow through the stress sensing piezoresistive elements 106, all the transistors with transfer gate 107 are biased in forward direction within the selected row. The operation is effected by connecting an output of one of the eight decoders 210, on basis of a binary address code, to high level and the remaining outputs simultaneously to the ground potential. Adjustment of the operating points is done by a divider 214. As a result, the electrical voltage drop on the individual stress sensors within the addressed row becomes measurable on the thirty-two outputs.

For practical applications, the sensor array 200 is provided with a cover layer (not shown in the drawing) made of a resilient material. When the device is in operation this has a multiple function: on the one hand it protects the monocrystalline Si membranes that get damaged very easily under mechanical impacts, on the other hand it transmits the acting force onto the sensing elements of the chips, and on the third hand it expands the active area.

FIG. 7B shows the SEM micrograph of the tactile sensor array 200 illustrated schematically in FIG. 7A, while FIG. 7C is a SEM micrograph that shows a portion of the sensor array 200. In FIG. 7C, one can clearly identify the various CMOS circuitries (decoder, current generator, transfer gates), as well as the individual 3D micro force sensing taxels 100 obtained through the integration of micromechanical elements (here membranes).

The invention claimed is:

1. A tactile sensor array comprising:
    sensor chips fabricated on a semiconductor wafer, each sensor chip comprising CMOS circuit elements and sensing micromechanical elements in integrated form, wherein said sensor chips are arranged in columns and rows;
    CMOS decoders in a number being equal to the number of rows/columns electrically connected to each sensing micromechanical element in a single row/column through MOS transfer gates of said CMOS circuit elements enabling simultaneous read-out of electrical signals generated by the sensing micromechanical elements addressed in a single row/column;
    MOS transistors driving piezoresistive elements through said MOS transfer gates as current generators, said piezoresistive elements being provided in the micromechanical sensing elements; and
    dividers for adjusting the operating points of said MOS transistors.

2. The tactile sensor array according to claim 1, wherein the sensing micromechanical elements of the sensor chips are covered by a layer to protect against mechanical impacts and for enlarging the active area thereof.

3. The tactile sensor array according to claim 1, wherein each sensing micromechanical element is in the form of a monocrystalline Si membrane comprising narrow and elongated bridging elements spanned above a cavity formed in a monocrystalline Si substrate by porous Si-etching and a central sheet located at the point where the bridging elements meet each other.

4. The tactile sensor array according to claim 3, wherein the piezoresistive elements are fabricated in the bridging elements and metallic contact pieces thereof ensure electric connection with at least a portion of said CMOS circuit elements.

5. A process for fabricating a tactile sensor array having:
    sensor chips formed in a semiconductor wafer being arranged in columns and rows, each sensor chip comprising CMOS circuit elements and sensing micromechanical elements in integrated form;
    CMOS decoders in a number being equal to the number of rows/columns electrically connected to each sensing micromechanical element in a single row/column through MOS transfer gates of said CMOS circuit elements enabling simultaneous read-out of electrical signals generated by the sensing micromechanical elements addressed in a single row/column;
    MOS transistors driving piezoresistive elements through said MOS transfer gates as current generators, said piezoresistive elements being provided in the micromechanical sensing elements; and
    dividers for adjusting the operating points of said MOS transistors;
    wherein the fabrication process comprising the processing sequence of:
    (a) forming domains of n-type semiconducting property within said semiconductor wafer of p-type semiconducting property for the n-wells of said CMOS circuit elements;
    (b) forming patterns of n-type domains within said semiconductor wafer for said sensing micromechanical elements simultaneously with or immediately after step (a);
    (c) fabricating said CMOS circuit elements of the sensor chips, as well as further CMOS circuitries comprising said CMOS decoders and MOS transistors within said semiconductor wafer by means of CMOS technology;
    (d) covering the CMOS circuit elements, said CMOS circuitries and the patterns of said n-type domains with a protecting layer;
    (e) starting a front-side isotropic porous Si-etching from the surface of the non-protected domains of said semiconductor wafer for fabricating said sensing micromechanical elements to become at least in their full extent underetched, thereby creating a porous Si sacrificial layer with an exposed surface which at least partially encloses said patterns of n-type domains after its fabrication;
    (f) passivating the exposed surface of said porous Si sacrificial layer by applying a metallic thin film thereon;
    (g) forming metallic contact pieces of said CMOS circuit elements and said CMOS circuitries by means of CMOS technology; and
    (h) removing the metallic thin film that covers the exposed surface of the porous Si sacrificial layer and releasing said sensing micromechanical elements by chemically dissolving said porous Si sacrificial layer.

6. The process for fabricating a tactile sensor array according to claim 5, wherein at least part of said CMOS circuit elements is located in the region of said sensing micromechanical element for each sensor chip.

7. The process for fabricating a tactile sensor array according to claim 5, wherein said protecting layer is comprised of at least a silicon dioxide layer obtained by chemical vapour deposition (CVD), a non-stochiometric silicon nitride layer and an undoped polycrystalline Si layer, formed in the given order.

8. The process for fabricating a tactile sensor array according to claim 7, wherein said non-stochiometric silicon nitride layer is formed by low pressure chemical vapour deposition (LPCVD) with setting the refractive index thereof to a value falling between 2.15 and 2.30.

9. The process for fabricating a tactile sensor array according to claim 5, wherein said passivation of the exposed surface of said porous Si sacrificial layer is performed by aluminium (Al).

10. The process for fabricating a tactile sensor array according to claim 5, wherein said dissolution of the porous Si sacrificial layer is performed by a mixture of NaOCl and a photoresist developer having a given mixing ratio.

11. The process for fabricating a tactile sensor array according to claim 10, wherein the mixing ratio of the NaOCl/photoresist developer mixture ranges from 1:3 to 1:10.

* * * * *